US011709275B2

(12) United States Patent
Farley et al.

(10) Patent No.: US 11,709,275 B2
(45) Date of Patent: Jul. 25, 2023

(54) ROOT MONITORING ON AN FPGA USING SATELLITE ADCS

(71) Applicant: Xilinx, Inc., San Jose, CA (US)

(72) Inventors: Brendan Farley, Dublin (IE); John K. Jennings, Dublin (IE); John G. O'Dwyer, County Kildare (IE)

(73) Assignee: XILINX, INC., San Jose, CA (US)

( * ) Notice: Subject to any disclaimer, the term of this patent is extended or adjusted under 35 U.S.C. 154(b) by 1050 days.

(21) Appl. No.: 16/506,064

(22) Filed: Jul. 9, 2019

(65) Prior Publication Data

US 2021/0011172 A1   Jan. 14, 2021

(51) Int. Cl.
  G01R 31/3185   (2006.01)
  G01R 31/3167   (2006.01)
  H03M 1/10   (2006.01)
  H03K 19/173   (2006.01)
  G01S 19/23   (2010.01)

(52) U.S. Cl.
  CPC .......... *G01S 19/23* (2013.01); *G01R 31/3167* (2013.01); *G01R 31/318516* (2013.01); *H03K 19/1733* (2013.01); *H03M 1/1071* (2013.01)

(58) Field of Classification Search
  None
  See application file for complete search history.

(56) References Cited

U.S. PATENT DOCUMENTS

| | | | |
|---|---|---|---|
| 6,956,512 B1 | 10/2005 | San et al. | |
| 7,138,820 B2 | 11/2006 | Goetting et al. | |
| 7,235,999 B2 | 6/2007 | Goetting et al. | |
| 7,650,248 B1 * | 1/2010 | Baxter | G01R 31/318519 341/157 |
| 8,182,141 B1 | 5/2012 | Collins et al. | |
| 8,207,882 B1 | 6/2012 | Jennings | |
| 8,638,084 B1 | 1/2014 | Abugharbieh et al. | |
| 9,377,795 B1 | 6/2016 | Cical et al. | |
| 10,054,968 B2 | 8/2018 | Kamath et al. | |
| 10,228,294 B2 | 3/2019 | Bach et al. | |
| 10,598,729 B1 * | 3/2020 | Jennings | H03M 1/1042 |

(Continued)

OTHER PUBLICATIONS

Jennings, "Device Monitoring Using Satellite ADCs Having Local Capacitors," U.S. Appl. No. 16/535,713, filed Aug. 8, 2019.

(Continued)

*Primary Examiner* — Jermele M Hollington
(74) *Attorney, Agent, or Firm* — Patterson + Sheridan, LLP

(57) ABSTRACT

Systems and methods for monitoring a number of operating conditions of a programmable device are disclosed. In some implementations, the system may include a root monitor including circuitry configured to generate a reference voltage, a plurality of sensors and satellite monitors distributed across the programmable device, and a interconnect system coupled to the root monitor and to each of the plurality of satellite monitors. Each of the satellite monitors may be in a vicinity of and coupled to a corresponding one of the plurality of sensors via a local interconnect. The interconnect system may include one or more analog channels configured to distribute the reference voltage to each of the plurality of satellite monitors, and may include one or more digital channels configured to selectively route digital data from each of the plurality of satellite monitors to the root monitor as data packets.

18 Claims, 7 Drawing Sheets

(56) References Cited

U.S. PATENT DOCUMENTS

| | | | | |
|---|---|---|---|---|
| 10,705,144 B1* | 7/2020 | Jennings | ........ | G01R 31/318516 |
| 11,012,072 B1* | 5/2021 | Jennings | .......... | H03K 19/00369 |
| 11,199,581 B1* | 12/2021 | Jennings | ............. | H03M 1/1042 |
| 11,271,581 B1* | 3/2022 | Jennings | ............... | H02M 3/157 |
| 2003/0169192 A1* | 9/2003 | Jonsson | ............. | H03M 1/1004 |
| | | | | 341/118 |
| 2014/0107857 A1* | 4/2014 | Yang | .................. | G05B 19/0423 |
| | | | | 700/298 |
| 2017/0272073 A1* | 9/2017 | Betz | ................ | H03K 19/17784 |
| 2017/0328790 A1 | 11/2017 | Bach et al. | | |
| 2018/0097825 A1* | 4/2018 | Pavlas | ................. | G06F 11/0751 |
| 2019/0041471 A1* | 2/2019 | Lazarov | ............. | G01R 33/0082 |

OTHER PUBLICATIONS

Jennings, "Device Monitoring Using Satellite ADCs Having Local Voltage Reference," U.S. Appl. No. 16/509,399, filed Mar. 4, 2020.
Voogel, "Lifetime Reliability Monitoring for Integrated Circuits," U.S. Appl. No. 16/676,025, filed Nov. 6, 2019.
Payne; Monitoring Process, Voltage, and Temperature in SoCs, Webinar Recap; SemiWiki.com, published Apr. 26, 2018, captured Nov. 17, 2018, pp. 1-3, www.semiwiki.com/forum/content/7424-monitoring-process-voltage-tempature-socs-webinar-recap.html.

* cited by examiner

ROOT MONITORING ON AN FPGA USING SATELLITE ADCS

TECHNICAL FIELD

This disclosure relates generally to integrated circuits, and specifically to monitoring one or more operating conditions of an integrated circuit.

BACKGROUND

Programmable logic devices (PLDs) are devices that may be programmed by a user to implement a variety of user-specified circuit designs. One example of a PLD is a field programmable gate array (FPGA). An FPGA may include an array of configurable logic blocks (CLBs), dedicated random access memory blocks (BRAM), input/output blocks (IOBs), digital signal processors (DSPs), a number of processing cores, and other subsystems (such as memory controllers, device management resources, and configuration circuitry) that may be selectively connected together by programmable interconnect structures. A user-specified circuit design may be implemented within a programmable device by loading configuration data representative of the user-specified circuit design into configuration registers that collectively determine the functions and operations performed by the various blocks, interconnect structures, and subsystems of the programmable device.

Electrical components within programmable devices are typically operated within specified operating conditions. For one example, electrical components may be designed to operate within a specified temperature range, and may be disabled or powered down if the operating temperature increases beyond a certain level. For another example, supply voltages are typically maintained between a minimum voltage level and a maximum voltage level to provide a relatively constant operating voltage to other electrical components provided within the programmable device. As programmable devices increase in size and complexity while using lower supply voltages and smaller device geometries, the accuracy with which their operating conditions can be monitored becomes increasingly important.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter. Moreover, the systems, methods and devices of this disclosure each have several innovative aspects, no single one of which is solely responsible for the desirable attributes disclosed herein.

One innovative aspect of the subject matter described in this disclosure can be implemented to monitor the operating conditions of various circuits and components distributed across a programmable device. In some implementations, the programmable device may include a plurality of configurable logic resources, a root monitor, a number of sensors distributed in various locations across the programmable device, a plurality of satellite monitors distributed in the various locations across the programmable device, and a network interconnect system coupled to the configurable logic resources, to the root monitor, and to each of the plurality of satellite monitors. Each of the sensors may be configured to measure the operating conditions of an associated circuit at a corresponding one of the various locations, and may provide analog signals indicative of the measured operating conditions to a corresponding one of the satellite monitors. In some aspects, the operating conditions may include at least one of a temperature or a voltage level of the associated circuit.

Each of the satellite monitors may include an analog-to-digital converter (ADC) having an input to receive the analog signals from one or more associated sensors, and having an output to provide the digital data to the network interconnect system. The ADC may convert the analog signals into digital data indicative of the operating conditions of one or more associated sensors, and may provide the digital data to the root monitor via the network interconnect system.

The root monitor may include circuitry configured to generate a reference voltage, and may include a memory configured to store digital data received from the plurality of satellite monitors. In some implementations, the root monitor may include a bandgap reference circuit that compensates the reference voltage for temperature variations. In addition, or in the alternative, the root monitor may include a controller configured to determine whether the measured operating conditions of the associated circuits are within a range. In some aspects, the controller may be further configured to generate an alarm based on the determination indicating that the measured operating conditions are not within the range.

The network interconnect system may be configured to distribute the reference voltage from the root monitor to each of the plurality of satellite monitors, and may be configured to selectively route digital data from each of the plurality of satellite monitors to the root monitor. In some implementations, the network interconnect system may include one or more analog channels configured to distribute the reference voltage from the root monitor to each of the plurality of satellite monitors, and may include one or more digital channels configured to selectively route the digital data from the satellite monitors to the root monitor. In some aspects, the digital data may be routed through the network interconnect system as individually addressable data packets. In other aspects, the digital data may be routed through the network interconnect system as non-packetized digital signals.

In some implementations, each of the satellite monitors may include a switch configured to selectively couple the reference voltage distributed by the interconnect system to the satellite monitor based on a control signal. The control signals may be generated by the root monitor, and may be distributed to corresponding satellite monitors via the network interconnect system (or by other suitable signal interconnects). In some aspects, the root monitor may selectively assert the control signals based on a timing schedule that allows only one of the satellite monitors to access the distributed reference voltage from the network interconnect system at any given point in time.

An example system for monitoring a number of operating conditions of a programmable device may include a root monitor, a plurality of sensors distributed across the programmable device, a plurality of satellite monitors distributed across the programmable device, and a network interconnect system coupled to at least the root monitor and each of the plurality of satellite monitors. The root monitor may include circuitry configured to generate a reference voltage that can be used for performing analog-to-digital conversions. In some implementations, the root monitor may include a bandgap reference circuit that compensates the reference voltage for temperature variations. In addition, or in the alternative, the root monitor may include a controller configured to determine whether the measured operating conditions of the associated circuits are within a range. In some aspects, the controller may be further configured to generate an alarm based on the determination indicating that the measured operating conditions are not within the range.

Each of the sensors may be configured to generate analog signals indicative of operating conditions of an associated circuit, and each of the satellite monitors may be configured to convert the analog signals generated by one or more associated sensors into digital data that can be routed to the root monitor via the network interconnect system.

The network interconnect system may include one or more analog channels configured to distribute the reference voltage to each of the plurality of satellite monitors, and may include one or more digital channels configured to selectively route the digital data from each of the plurality of satellite monitors to the root monitor. In some aspects, the digital data may be routed through the network interconnect system as individually addressable data packets. In other aspects, the digital data may be routed through the network interconnect system as non-packetized digital signals.

Each of the satellite monitors may include an analog-to-digital converter (ADC) configured to convert the analog signals into the digital data. In some implementations, each of the satellite monitors may include a switch configured to selectively couple the reference voltage distributed by the interconnect system to the satellite monitor based on a control signal. The control signals may be generated by the root monitor, and may be distributed to corresponding satellite monitors via the network interconnect system (or by other suitable signal interconnects). In some aspects, the root monitor may selectively assert the control signals based on a timing schedule that allows only one of the satellite monitors to access the distributed reference voltage from the network interconnect system at any given point in time.

An example method disclosed herein may be used to monitor a number of operating conditions of a programmable device. The method may include generating a reference voltage using a voltage generator associated with a root monitor provided within the programmable device, and distributing the reference voltage to each of a plurality of satellite monitors using one or more analog channels of a network interconnect system integrated within the programmable device. In some implementations, distributing the reference voltage may include selectively coupling each of the plurality of satellite monitors to the network interconnect system based on a corresponding control signal. The control signals may be generated by the root monitor and distributed to the plurality of satellite monitors by the network interconnect system. In some aspects, the root monitor may selectively assert the control signals based on a timing schedule that allows only one of the satellite monitors to access the distributed reference voltage from the network interconnect system at any given point in time.

The method may also include generating, using each of a number of sensors, analog signals indicative of operating conditions of an associated circuit, and providing the analog signals to corresponding ones of the plurality of satellite monitors. The analog signals may be converted into digital data using the plurality of satellite monitors, and the digital data may be selectively routed from the plurality of satellite monitors to the root monitor using one or more digital channels of the network interconnect system. In some aspects, the digital data may be routed through the network interconnect system as individually addressable data packets. In other aspects, the digital data may be routed through the network interconnect system as non-packetized digital signals.

The method may also include determining whether the operating conditions of the associated circuits are within a range, and selectively generating one or more alarms based on the determination. In some implementations, an alarm may be generated when the operating conditions of at least one of the associated circuits are not within the range, which may indicate that the at least one of the associated circuits is operating outside of certain conditions.

BRIEF DESCRIPTION OF THE DRAWINGS

The example implementations are illustrated by way of example and are not intended to be limited by the figures of the accompanying drawings. Like numbers reference like elements throughout the drawings and specification. Note that the relative dimensions of the following figures may not be drawn to scale.

DETAILED DESCRIPTION

Figure 1:
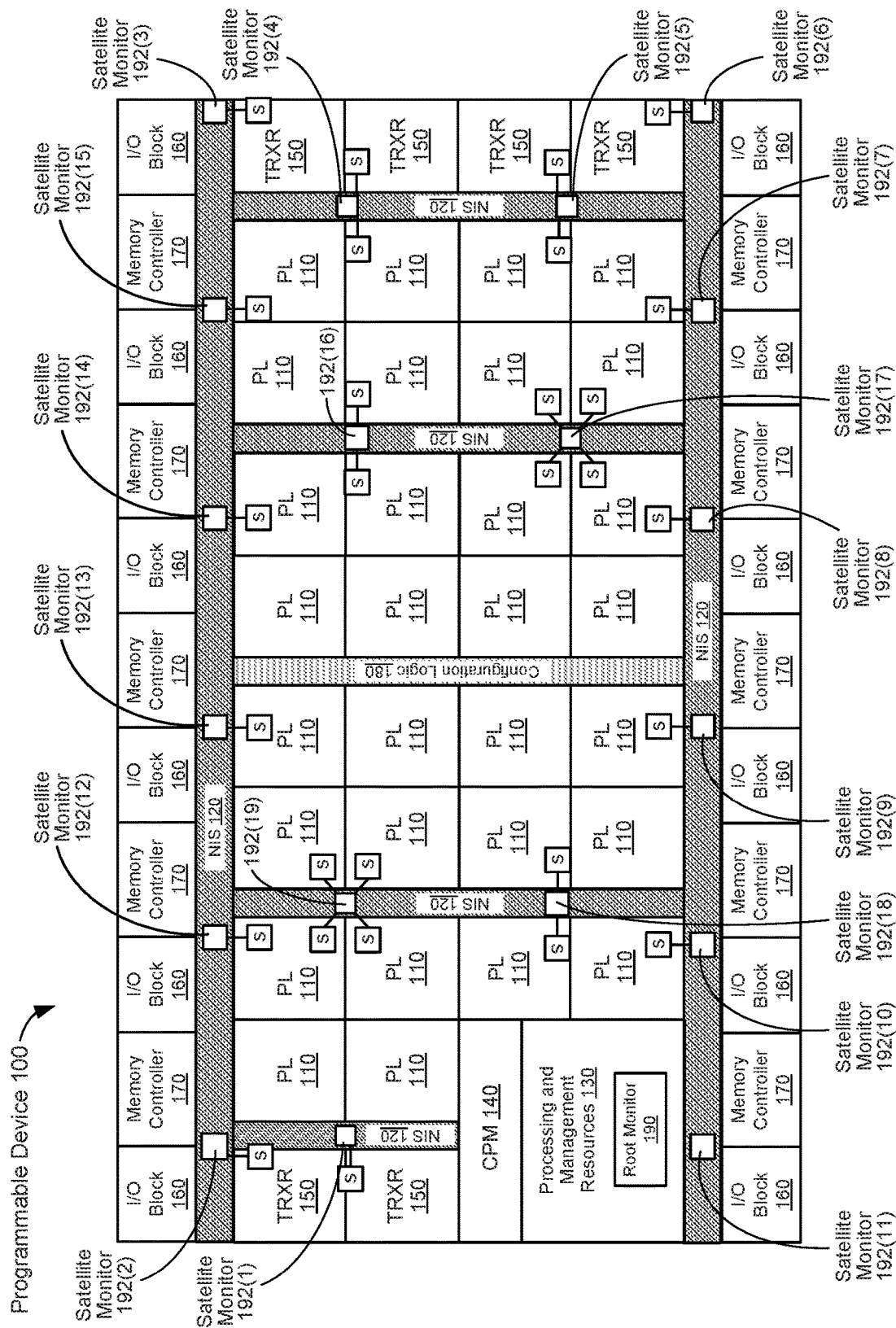
FIG. 1 is a block diagram of an example programmable device within which various aspects of the present disclosure may be implemented.

Implementations of the subject matter described in this disclosure may be used to monitor a number of operating conditions of a programmable device. The operating conditions may be any suitable measure of the device's operating characteristics or parameters including, for example, a temperature of a circuit or component provided within the programmable device, a temperature of a circuit or device external to the programmable device, a voltage level of a supply voltage, and the like. In accordance with some aspects of the present disclosure, a monitoring system may be implemented in a programmable device that includes programmable logic, dedicated circuitry such as processors and DSPs, and a network interconnect system that can route information between the programmable logic, the dedicated circuitry, and other circuits or components of the programmable device using individually addressable data packets.

The monitoring system may include a root monitor, a number of sensors distributed in various locations across the programmable device, and a plurality of satellite monitors distributed in the various locations across the programmable device. Each of the sensors may generate analog signals indicative of one or more operating conditions of an associated circuit, and may provide the analog signals to a corresponding one of the satellite monitors. Each of the satellite monitors may include an ADC to convert the analog signals into digital data, and the network interconnect system may route the digital data from each of the satellite monitors to the root monitor. In some implementations, each of the satellite monitors may be positioned in a vicinity of a corresponding sensor, for example, so that analog signals generated by the corresponding sensor are not routed across the programmable device to the root monitor for conversion to digital data, but instead are routed a relatively short distance to the corresponding satellite monitor, via local signal wires, for conversion to digital data.

In other implementations, digital data generated by the satellite monitors may be routed to the root monitor using other suitable routing resources provided within the device including (but not limited to) clock distribution networks, programmable interconnect fabric, and/or routing resources provided within each of the programmable logic tiles in the device.

The root monitor may receive the digital data generated by each of the satellite monitors via the network interconnect system, and may analyze the digital data to determine whether one or more of the circuits being monitored are not operating within a specified operating range. In some implementations, the root monitor may generate a trimmed and temperature-compensated reference voltage, and the network interconnect system may distribute the trimmed and temperature-compensated reference voltage to each of the satellite monitors located throughout the device.

Conventional systems for monitoring operating conditions of various circuits distributed across a programmable device typically include a central system monitor and a plurality of sensors positioned near the circuits to be monitored. Each sensor generates analog signals indicative of the operating conditions of an associated circuit, and the analog signals are routed from each of the sensors to the system monitor for conversion to digital data. The sensors are typically distributed in various locations throughout the device, and therefore the analog signals generated by at least some of the sensors may be routed across large portions of the device to reach the system monitor. Because analog signals indicative of operating conditions may be particularly susceptible to noise and interference, some programmable devices may use dedicated metal-layer routing resources with shielding properties to route these analog signals from the various sensors to the system monitor for conversion to digital data.

Although the shielding properties of such dedicated metal-layer routing resources may reduce signal degradation and data loss, the dedicated metal-layer routing resources are expensive and consume significant amounts of the device's metal layers. In addition, because programmable logic is typically implemented as a plurality of repeatable tiles arranged in a number of rows or columns, the signal routing resources embedded within each of the repeatable tiles is typically based on a worst-case routing scenario (such as for tiles to be placed in locations in which device density is the greatest). As a result, many of the repeatable tiles are over-equipped with signal routing resources, which may result in unused routing resources and/or may limit scalability of the programmable device.

Particular implementations of the subject matter described in this disclosure can be implemented to realize one or more of the following potential advantages. By deploying a plurality of satellite monitors having analog-to-digital conversion capabilities in locations throughout the programmable device proximate to sensors that monitor the operating conditions of various circuits, the monitoring systems disclosed herein may convert analog signals generated by the sensors into digital data using local satellite monitors, and then route digital data from the various locations throughout the device to the root monitor. As a result, the analog signals are not routed across large portions of the device and then converted to digital data, but instead are transmitted relatively short distances to the nearest satellite monitor for conversion to digital data, which is then routed to the root monitor using the network interconnect system. In some aspects, digital data generated by the satellite monitors may be routed to the root monitor as individually addressable data packets. In other aspects, digital data generated by the satellite monitors may be routed to the root monitor as non-packetized data. By converting the analog signals into digital data using satellite monitors positioned in the vicinities of the sensors, rather than performing analog-to-digital conversions in the root monitor, the monitoring systems disclosed herein do not need metal-layer routing resources, which in turn may reduce cost while increasing scalability of the programmable device. In addition, performing the analog-to-digital conversions locally (e.g., in the vicinities of the sensors) and routing the resulting digital data from the satellite monitors to the root monitor may allow more sensor data to be collected and analyzed by the root monitor (as compared to prior techniques that route analog signals from various sensors located throughout the device to an ADC provided within a system monitor), for example, because the ADCs distributed throughout the programmable device may perform analog-to-digital conversions in parallel (e.g., at the same time).

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example implementations. However, it will be apparent to one skilled in the art that these specific details may not be required to practice the example implementations. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example implementations are not to be construed as limited to specific examples described herein but rather to include within their scope all implementations defined by the appended claims.

FIG. 1 shows a block diagram of an example programmable device 100 within which various aspects of the present disclosure may be implemented. The device 100 may include a number of subsystems such as, for example, programmable logic (PL) 110, a network interconnect system 120, processing and management resources (PMR) 130, a CCIX and PCIe Module (CPM) 140, transceiver blocks 150, input/output (I/O) blocks 160, memory controllers 170, configuration logic 180, a root monitor 190, a plurality of satellite monitors 192(1)-192(19), and a number of sensors (S). In one or more implementations, the device 100 may include other subsystems or components not shown in FIG. 1. Further, although not shown for simplicity, the device 100 may be coupled to a number of peripheral components (such as a high-performance memory device) and/or other devices or chips (such as another programmable device).

The PL 110 includes programmable circuitry that may be configured or programmed to perform a multitude of different user-defined functions or operations. In some implementations, the PL 110 may include a plurality of programmable circuit device 100, for example, as depicted in FIG. 1. The programmable circuit blocks, which may also be referred to as programmable fabric sub-regions (FSRs), may each include programmable interconnect circuitry and programmable logic circuitry. In some implementations, the programmable circuit blocks may include (but are not limited to) configurable logic blocks (CLBs), random access memory blocks (BRAM), digital signal processing blocks (DSPs), clock managers, delay lock loops (DLLs), and/or other logic or circuits that can be programmed or configured to implement a user-specified circuit design.

The programmable interconnect circuitry within each of the programmable circuit blocks or tiles may include a plurality of interconnect wires of varying lengths interconnected by programmable interconnect points (PIPs). The interconnect wires may be configured to provide connectivity between components within a particular programmable tile, between components within different programmable tiles, and between components of a programmable tile and other subsystems or devices. The programmable interconnect circuitry and the programmable circuit blocks may be programmed or configured by loading configuration data into configuration registers that define how the programmable elements are configured and operate to implement a corresponding user-specified circuit design. In some aspects, the programmable interconnect circuitry within each of a number of the programmable circuit blocks may form part of a programmable interconnect fabric (not shown for simplicity) that provides block-level and/or device-level signal routing resources for the device 100.

The network interconnect system 120, which may be fabricated as part of the device 100, may include any number of horizontal segments and vertical segments (and/or diagonal segments) connected together to implement a high-speed, high-bandwidth programmable signal routing network that can selectively interconnect various device resources (such as the PL 110, the PMR 130, the CPM 140, the transceiver blocks 150, the I/O blocks 160, the memory controllers 170, the configuration logic 180, the root monitor 190, and the satellite monitors 192(1)-192(19)) with each other and with other components not shown for simplicity. For the example implementation of FIG. 1, the network interconnect system 120 is shown to include two horizontal segments and four vertical segments. A first horizontal segment extending across the width of the device 100 is positioned along a bottom boundary of the device 100, and a second horizontal segment extending across the width of the device 100 is positioned along the top boundary of the device 100. The four vertical segments extend across the height of the device 100 and are connected to the first and second horizontal segments of the network interconnect system 120. In some aspects, the horizontal segments may allow the network interconnect system 120 to exchange signals and data with the I/O blocks 160 and memory controllers 170 without any intervening circuits or interfaces, and the vertical segments may allow the network interconnect system 120 to exchange signals and data with the transceiver blocks 150, the processing and management resources (PMR) 130, and the CPM 140 without any intervening circuits or interfaces. In other implementations, the network interconnect system 120 may include other numbers of horizontal and vertical segments, which in turn may occupy other positions of the device 100. Thus, the particular layout, shape, size, orientation, and other physical characteristics of the example network interconnect system 120 depicted in FIG. 1 are merely illustrative of the various implementations disclosed herein.

The network interconnect system 120 may be configured to transmit information between various device resources as data packets that can be individually addressed and routed from a source location to a destination location. In some aspects, the data packets transmitted on the network interconnect system 120 may be dynamically addressable. In one or more implementations, the network interconnect system 120 may employ a suitable data packet protocol (such as token ring protocol) and/or use memory-mapped addresses to route data packets from any number of source locations to any number of destination locations. The data packets may include header information (such as source addresses, destination addresses, and protocol information) that can be used by the network interconnect system 120 to route the data packets to their indicated destinations.

In some implementations, the data packets may include Quality-of-Service (QoS) information that allows the transmission of data packets through the network interconnect system 120 to be prioritized, for example, based on assigned priorities, traffic types, traffic flows, and/or other criteria. In such implementations, the network interconnect system 120 may include priority logic that can determine priority levels or traffic classes of received data packets, and use the determined priority levels or traffic classes when queuing the data packets for transmission. By transmitting information between various device resources as individually-addressable data packets, the network interconnect system 120 may provide connectivity between the various device resources, irrespective of a particular user-specified circuit design, thereby significantly increasing the signal routing capabilities of the device 100 (as compared to conventional programmable devices). For example, while the programmable interconnect fabric and other tile-based signal routing structures of the device 100 are typically configured to provide point-to-point signal connections between specified circuits, the network interconnect system 120 may concurrently route each of a plurality of data packets from any source address to any destination address on the device 100, thereby providing system-level connectivity for the device 100.

Although not shown for simplicity, the network interconnect system 120 may also include a scheduler and arbitration logic. The scheduler may be used to schedule the transmission of data packets from a source address to a destination address using one or more physical and/or virtual channels of the network interconnect system 120. The arbitration logic may be used to arbitrate access to the network interconnect system 120, for example, to minimize collisions and other contention-related latencies. For implementations in which the device 100 is fabricated using stacked silicon interconnect (SSI) technology, the columnal portions of the network interconnect system 120 may provide signal connections between adjacent super logic regions (SLRs), for example, to allow configuration data to be routed between master and slave SLRs.

The network interconnect system 120 may be programmed by loading configuration data into corresponding configuration registers that define how various switches, interfaces, and routers within or associated with the network interconnect system 120 are configured to implement a particular user-specified circuit design. In some implementations, the network interconnect system 120 may include a plurality of nodes, ports, or other interfaces (not shown for simplicity) that provide selective connectivity between the network interconnect system 120 and the various resources, subsystems, circuits, and other components of the device 100. For example, the network interconnect system 120 may allow multiple subsystems of the device 100 to share access to on-chip memory (OCM) resources, processing resources, I/O resources, and/or the transceiver blocks 150. The nodes, ports, or other interfaces of the network interconnect system 120 may be programmed to implement a particular connectivity profile by loading configuration data into a number of associated configuration registers.

By selectively interconnecting the various resources, subsystems, circuits, and other components of the device 100 that can demand and use large amounts of data, the network interconnect system 120 may alleviate signal routing burdens on local interconnect resources, thereby increasing device performance and allowing for greater configuration flexibility than other programmable devices. Moreover, by providing a high-performance signal routing network having higher data transmission rates and lower error rates than device-level and block-level programmable interconnects, the network interconnect system 120 may increase the processing power and data throughput of the device 100 (as compared to other programmable devices).

The processing and management resources (PMR) 130 may provide dedicated data processing capabilities and platform management resources for the device 100. The PMR 130 may include a processing system (PS) and a platform management controller (PMC), as described in more detail with respect to FIG. 2. In some implementations, the PS may include a number of processor cores, cache memory, memory controllers, and unidirectional and/or bidirectional interfaces configurable to couple directly to the I/O pins of the device 100. In some aspects, each processor core may include central processing units (CPU) or scalar processors that can be used for sequential data processing. The PMC may be used for booting and configuring the device 100 based on configuration data (such as a configuration bitstream) provided from external memory. The PMC may also be used to configure the PL 110 and to control various encryption, authentication, root monitoring, and debug capabilities of the device 100.

The CCIX and PCIe module (CPM) 140 may include a number of interfaces that provide connectivity between the device 100 and a number of peripheral components (such as external devices or chips). In some implementations, the CPM 140 may include a number of peripheral interconnect express (PCIe) interfaces and cache coherent interconnect for accelerators (CCIX) interfaces that provide connectivity to other devices or chips via the transceiver blocks 150. In some aspects, the PCIe and CCIX interfaces may be implemented as part of the transceiver blocks 150. One example implementation of the CPM 140 is described with respect to FIG. 2.

The transceiver blocks 150 may provide signal connections with one or more other devices or chips (not shown for simplicity) connected to the device 100. The transceiver blocks 150 may include a number of different serial transceivers such as, for example, gigabit serial transceivers (GTs). In some implementations, the transceiver blocks 150 may be implemented as a number of repeatable tiles positioned in various locations along the right and left sides of the device 100, as depicted in FIG. 1. In other implementations, the transceiver blocks 150 may be positioned in other suitable locations of the device 100. In one or more implementations, each of the transceiver blocks 150 may be coupled to one or more associated voltage supplies (not shown for simplicity). In some aspects, each bank of transceiver circuits within a given transceiver block 150 may include or may be coupled to a corresponding voltage supply, for example, so that each bank of transceiver circuits may be powered using a separate voltage supply.

The I/O blocks 160 are coupled to the device's I/O pins (not shown for simplicity), and may provide I/O capabilities for the device 100. For example, the I/O blocks 160 may receive data from one or more other devices, and may drive the received data to a number of destinations in the device 100. The I/O blocks 160 may also receive data from a number of sources in the device 100, and may drive the received data to one or more other devices via the device's I/O pins. In some implementations, the I/O blocks 160 may be implemented as repeatable tiles. The device 100 may include any suitable number of I/O blocks 160, and therefore the example implementation depicted in FIG. 1 is merely illustrative.

The I/O blocks 160 may include any number of suitable I/O circuits or devices. In some implementations, the I/O blocks 160 may include extremely high-performance I/O (XPIO) circuits, high-density I/O (HDIO) circuits, and multiplexed I/O (MIO) circuits. The XPIO circuits may be optimized for high-performance communications such as providing a high-speed, low latency interface to the memory controllers 170. In one or more implementations, the XPIO circuits may include dedicated memory resources that can be accessed by other subsystems of the device 100 without using the memory controllers 170. The HDIO circuits may provide a cost-effective solution that supports lower speed and higher voltage I/O capabilities (as compared with the XPIO circuits). The MIO circuits may provide general-purpose I/O resources that can be accessed by various subsystems such as, for example, the PL 110, the PMR 130, and the CPM 140.

The memory controllers 170 may be used to control access to various memory resources provided within and/or external to the device 100. In some implementations, the memory controllers 170 may be used to access dedicated memory residing in one or more of the I/O blocks 160. The memory controllers 170 may include double data rate v4 (DDR4) memory controllers, high bandwidth memory (HBM) controllers, and/or other suitable memory controllers. In one or more implementations, some or all of the memory controllers 170 may include a scheduler having transaction reordering capabilities that may improve memory access efficiency. In addition, or in the alternative, the repeatable tiles that implement the memory controllers 170 may be different from one another. For example, a first number of the memory controllers 170 may implement DDR4 memory controllers, a second number of the memory controllers 170 may implement LPDDR4 memory controllers, and a third number of the memory controllers 170 may implement HBM controllers.

The device 100 may include any number of I/O blocks 160 and memory controllers 170, and therefore the numbers and positions of the I/O blocks 160 and memory controllers 170 depicted in FIG. 1 are merely illustrative. In some implementations, a first row of I/O blocks 160 and memory controllers 170 may be implemented as repeatable tiles positioned along the bottom edge of the device 100, and a second row of I/O blocks 160 and memory controllers 170 may be implemented as repeatable tiles positioned along the top edge of the device 100. In some implementations, the I/O blocks 160 and memory controllers 170 may be alternately positioned or distributed relative to each other, for example, as depicted in the example of FIG. 1. In other implementations, a pair of I/O blocks 160 and memory controllers 170 may be implemented within the same repeatable tile.

In some implementations, the first row of I/O blocks 160 and memory controllers 170 positioned along the bottom of the device 100 may be coupled to the first horizontal segment of the network interconnect system 120, and the second row of I/O blocks 160 and memory controllers 170 positioned along the top of the device 100 may be coupled to the second horizontal segment of the network interconnect system 120. In this manner, the network interconnect system 120 may provide connectivity between the programmable resources of the device 100 and its I/O pins (not shown for simplicity).

In some implementations, the device 100 may include one or more columns of connectivity fabric (not shown for simplicity) extending vertically across the height of the device 100 and positioned in a vicinity of the transceiver blocks 150. The connectivity fabric may include a number of hard-wired circuits including (but not limited to) USB controllers, Ethernet MACs, multi-rate (MR) Ethernet MACs (MRMACs), PCIe controllers, CCIX controllers, and/or other components to provide connectivity between the transceiver blocks 150 and the PL 110.

The configuration logic 180 may be used to load configuration data (such as a configuration bitstream) from an external memory and route portions (such as frames, words, bytes, and/or bits) of the configuration data to the appropriate configuration registers that define how the various programmable resources of the device 100 are configured. The configuration logic 180 may also be used to partially reconfigure the device 100 and/or to internally reconfigure one or more portions of the device 100. In some implementations, the configuration logic 180 may include configuration registers, boundary-scan test circuitry (such as TAP controller circuitry), encryption circuitry to encrypt bitstreams of configuration data read out of the device 100, and decryption circuitry to decrypt bitstreams of configuration data loaded into the device 100.

Although not shown for simplicity, the device 100 may include an interface between the programmable fabric and each of the rows of I/O blocks 160 and memory controllers 170 positioned on the boundary of the device 100. This interface, which may be referred to herein as a Boundary Logic Interface (BLI), may allow large and complex external devices (such as HBM) to appear as much smaller blocks (such as a CLB) in the programmable fabric of the device 100. In some implementations, the BLI may be arranged in rows positioned at the top and bottom boundaries or edges of the programmable fabric. In this manner, the BLI may be used to route signals between columnar logic structures (such as a CLB column or a DSP column) and rows of I/O resources (such as the I/O blocks 160).

In accordance with various aspects of the present disclosure, the programmable device 100 may include a monitoring system that can monitor one or more operating conditions of a plurality of selected circuits provided throughout the programmable device 100, for example, to ensure that the selected circuits operate within specified operational parameters. The monitoring system disclosed herein may measure any suitable operating condition of the selected circuits including, for example, temperature, voltage levels, and current levels. As used herein, the term "selected circuits" may refer to any circuit, component, supply voltage, structure, or device that can be selected for monitoring one or more operating conditions to ensure proper operation of the device 100. In some implementations, the monitoring system may generate an alarm (or multiple alarms) when the measured operating conditions of one or more of the selected circuits do not fall within a specified range of operating conditions. In some aspects, the alarms may be used to power-down a number of circuits or components of the device 100. In other aspects, the alarms may be used to power-down the entire device 100.

The monitoring system may include (or may be formed by) the root monitor 190, the satellite monitors 192(1)-192(19), the sensors (S), and at least a portion of the network interconnect system 120. The root monitor 190 is coupled to the network interconnect system 120, and may include circuitry configured to generate a reference voltage. The reference voltage generated by the root monitor 190 may be a trimmed and temperature-compensated voltage suitable for analog-to-digital conversions. In some implementations, the root monitor 190 may be positioned within the processor system of the device 100, for example, as depicted in FIG. 1. In other implementations, the root monitor 190 may be positioned in other suitable locations in the device 100.

The reference voltage may be distributed to each of the satellite monitors 192(1)-192(19) via the network interconnect system 120, thereby eliminating the need to place multiple voltage generators at various locations across the device 100 to provide the reference voltage to each of the satellite monitors 192(1)-192(19). In some implementations, the network interconnect system 120 may include one or more analog channels to distribute the reference voltage from the root monitor 190 to each of the satellite monitors 192(1)-192(19), and may include one or more digital channels to selectively route digital data from the satellite monitors 192(1)-192(19) to the root monitor 190.

The sensors (S) may be any suitable sensing circuit or device that can generate electrical signals indicative of one or more operating conditions of at least one of the selected circuits, and may include (but are not limited to) temperature sensors, voltage sensors, and/or current sensors. In some implementations, each sensor (S) may measure the operating conditions of one or more selected circuits, and may provide analog signals indicative of the measured operating conditions to a corresponding one of the satellite monitors 192(1)-192(19).

The satellite monitors 192(1)-192(19) may be any suitable circuit or device that can convert analog signals generated by the sensors (S) into digital data indicative of the measured operating conditions of the selected circuits. Although not shown in FIG. 1 for simplicity, in some implementations, each of the satellite monitors 192(1)-192(19) may include at least an analog-to-digital converter (ADC) and a memory. The ADC, which may be any suitable circuit that can convert analog signals into digital data, may include one or more inputs to receive analog signals generated by a number of associated sensors (S), one or more outputs to provide digital data indicative of the operating conditions measured by the associated sensors (S), and one or more reference terminals to receive a local reference voltage. In some implementations, the local reference voltage may be based at least in part on the reference voltage generated by the root monitor and distributed to the satellite monitors 192(1)-192(19) by the network interconnect system 120. The memory may store digital data generated by the ADC, and may provide the digital data to the network interconnect system 120 for routing to the root monitor.

The sensors (S) and the satellite monitors 192(1)-192(19) may be distributed throughout the programmable device 100 and positioned in various locations near the selected circuits, for example, so that analog signals indicative of operating conditions of the selected circuits may be converted to digital signals at the various distributed locations (rather than transmitted to a central hub and then converted into digital data). In some implementations, each of the sensors (S) may be positioned in a vicinity of a corresponding selected circuit, for example, so that the sensor (S) and the corresponding selected circuit may be coupled together using local signal lines. Similarly, each of the satellite monitors 192(1)-192(19) may be positioned in a vicinity of one or more associated sensors (S), for example, so that the satellite monitor 192 and the one or more associated sensors (S) may be coupled together using local signal lines. In some aspects, the term "vicinity" as used herein may refer to a distance over which analog signals indicative of operating conditions can be transmitted via relatively short local signal wires with minimal signal degradation.

For the example of FIG. 1, a first group of sensors (S) located within the transceiver blocks 150 may be positioned in the respective vicinities of voltage supplies (not shown for simplicity) associated with the transceiver blocks 150, and a first group of satellite monitors 192(1)-192(6) may be positioned in the vicinities of the first group of sensors (S), for example, so that each of the first group of sensors (S) may be coupled to a corresponding supply voltage and to a corresponding satellite monitor 190 by relatively short local signal wires. In some implementations, each of the first group of sensors (S) may be configured to generate analog signals indicative of one or more operating conditions of a corresponding voltage supply, and each of the first group of satellite monitors 192(1)-192(6) may be configured to convert analog signals generated by the associated sensor (S) into digital data that can be transmitted to the root monitor 190 via the network interconnect system 120.

A second group of sensors (S) located within the PL 110 may be positioned in the vicinities of a number of corresponding selected circuits (not shown for simplicity) within or associated with the PL 110, and a second group of satellite monitors 192(7)-192(19) may be positioned in the vicinities of the second group of sensors (S), for example, so that each of the second group of sensors (S) may be coupled to a corresponding selected circuit and to a corresponding one of the second group of satellite monitors 192(7)-192(19) by relatively short local signal wires. In some implementations, each of the second group of sensors (S) may be configured to generate analog signals indicative of one or more operating conditions of a corresponding selected circuit, and each of the second group of satellite monitors 192(7)-192 (19) may be configured to convert analog signals generated by the associated sensor (S) into digital data that can be transmitted to the root monitor 190 via the network interconnect system 120.

Each of the satellite monitors 192(1)-192(19) may be coupled to any suitable number of sensors (S) by local signal lines. For one example, satellite monitor 192(1) may be coupled to a single sensor (S) positioned within the transceiver blocks 150, and may generate digital signals indicative of one or more operating conditions of a corresponding voltage supply associated with the transceiver blocks 150. For another example, satellite monitor 192(16) may be coupled to two sensors (S) positioned within the PL 110, and may generate digital signals indicative of one or more operating conditions of selected circuits associated with the two sensors (S) positioned within the PL 110. For another example, satellite monitor 192(17) may be coupled to four sensors (S) positioned within the PL 110, and may generate digital signals indicative of one or more operating conditions of selected circuits associated with the four sensors (S) positioned within the PL 110. Further, although shown in FIG. 1 to include 18 satellite monitors 192(1)-192(19), the programmable device 100 may include other numbers of satellite monitors 192 positioned in other suitable locations of the programmable device 100.

As described above, the satellite monitors 192(1)-192(19) may be positioned sufficiently close to the sensors (S) so that each of the sensors (S) can be coupled to a corresponding satellite monitor 192 using relatively short local signal wires, rather than transmitting analog signals over relatively long distances for conversion to digital data using central system monitor. In this manner, implementations of the monitoring systems disclosed herein may eliminate the need for metal-layer signal routing resources to route these analog signals from various locations distributed throughout the device 100 to a central monitor for conversion to digital data, which may reduce device complexity and cost while also increasing scalability of the monitoring system. Moreover, by using a plurality of satellite monitors 192(1)-192 (19) distributed throughout the device 100 to perform analog-to-digital conversions of analog sensor data and then routing the digital data to the root monitor 190 for analysis, the number of sensors that can be simultaneously measured is not limited by the number of input channels of the ADCs provided within the satellite monitors. In contrast, the number of sensors that can be simultaneously measured by conventional solutions which route analog sensor data to a central system monitor for conversion to digital data is limited by the number of input channels of the ADC associated with the system monitor. Thus, by distributing the conversion of analog sensor data into digital information throughout the device 100 via the satellite monitors 192(1)-192(19), the number of sensors that can be simultaneously measured by monitoring systems disclosed herein is based on the number of satellite monitors 192(1)-192(19), rather than on the number of input channels of any particular ADC. As a result, the monitoring systems disclosed herein may simultaneously measure a much greater number of sensors than the aforementioned conventional solutions.

The root monitor 190 may receive the digital data routed from each of the satellite monitors 192(1)-192(19) by the network interconnect system 120, and may process the received digital data to determine the operating conditions of the selected circuits monitored by the sensors. In some implementations, the root monitor 190 may compare the measured operating conditions with one or more reference values to determine whether each of the selected circuits is operating within its specified operating range.

Note that FIG. 1 is intended to illustrate only one example architecture of the programmable device 100. For example, the numbers of logic blocks in a column (or row), the relative width of the columns (or rows), the number and order of columns (or rows), the types of logic blocks included in the columns (or rows), the relative sizes of the logic blocks, and other architectural aspects shown in FIG. 1 are merely illustrative of the various implementations of the inventive subject matter disclosed herein.

Figure 2:
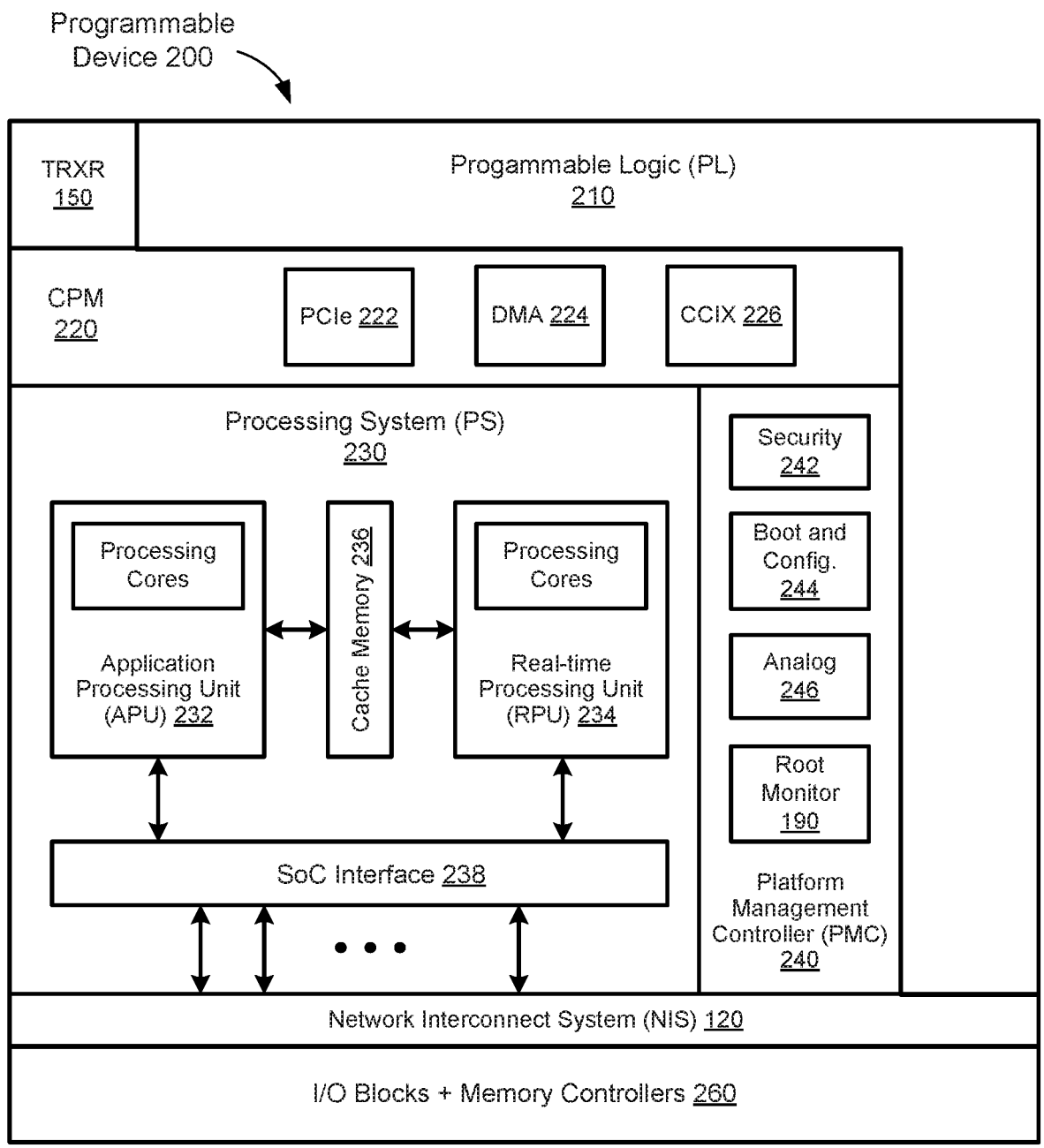
FIG. 2 shows a functional block diagram of a portion of the programmable device of FIG. 1, in accordance with some implementations.

FIG. 2 shows a functional block diagram of a programmable device 200 that may be one example of the programmable device 100 of FIG. 1, in accordance with some implementations. The device 200 is shown to include a transceiver block 150, programmable logic (PL) 210, a CPM 220, a processing system (PS) 230, a platform management controller (PMC) 240, and I/O blocks+memory controllers 260. The PL 210, which may be one implementation of the PL 110 of FIG. 1, may be adjacent to and directly connected to the transceiver blocks 150, the CPM 220, the PMC 240, and the network interconnect system 120. The I/O blocks+ memory controllers 260, which may be one implementation of the I/O blocks 160 and memory controllers 170 of FIG. 1, may be implemented as a plurality of repeatable tiles arranged along the bottom edge of the programmable device 200. Although not shown in FIG. 2 for simplicity, the I/O blocks+memory controllers 260 may also be implemented as a plurality of repeatable tiles arranged along the top edge of the programmable device 200. In addition, or in the alternative, the I/O blocks+memory controllers 260 may be implemented as a plurality of repeatable tiles arranged along the right and left edges of the programmable device 200.

The CPM 220, which may be one implementation of the CPM 140 of FIG. 1, may provide interfacing capabilities for a number of different bus standards. In some implementations, the CPM 220 may include a peripheral component interconnect express (PCIe) interface 222, a direct memory access (DMA) circuit 224, and a cache coherent interconnect for accelerators (CCIX) interface 226. The PCIe interface 222 may be used to exchange data between the PS 230 and one or more other devices or chips via the transceiver blocks 150 according to a PCI protocol. Similarly, the CCIX interface 226 may be used to exchange data between the PS 230 and one or more other devices or chips via the transceiver blocks 150 according to a CCIX protocol.

The PS 230 may provide dedicated data processing capabilities for the device 200, and is shown to include an application processing unit (APU) 232, a real-time processing unit (RPU) 234, cache memory 236, and a system-on-a-chip (SoC) interface 238. Although not shown for simplicity, the PS 230 may also include peripherals for communication standards (such as Ethernet and USB 2.0 interfaces) and various controllers (such as SPI, I2C, UART, and CAN-FD controllers). The APU 232 and the RPU 234 may each include one or more processing cores (such as CPUs) that can provide dedicated scalar processing capabilities for the device 200. In some aspects, the PS 230 may be selectively connected to other subsystems of the device 200 by the programmable interconnect fabric and the network interconnect system 120.

In some implementations, the APU 232 may include a multi-core ARM processor that supports hardware virtualization, and may have a built-in interrupt controller and snoop control unit. The interrupt controller may support virtual interrupts, and the snoop control unit may be used maintain coherency between one or more caches used and/or shared by APU 232 and RPU 234. The APU 232 may communicate with other components of the PS 230 using an AXI coherent extension (ACE) port, and may communicate with the PL 210 using an accelerator coherency port (ACP). In some implementations, the RPU 234 may include a multi-core ARM processor that supports real-time data processing, may include tightly coupled memory (TCM) interface for real-time single cycle access, and may have a dedicated interrupt controller and floating point unit. The RPU 234 may communicate with other components of the PS 230 and/or with the PL 210 using AXI ports.

The cache memory 236 may be any suitable high-speed cache that allows for shared access by the APU 232 and the RPU 234. The SoC interface 238 may provide connectivity between various resources of the PS 230 and the network interconnect system 120.

The PMC 240 may include security circuitry 242, booting and reconfiguration circuitry 244, analog circuitry 246, and the root monitor 190 of FIG. 1. The security circuitry 242 may provide data encryption/decryption capabilities and other security features. The booting and reconfiguration circuitry 244 may provide a multi-stage boot process that supports both a non-secure and a secure boot. The analog circuitry 246 may include any suitable analog circuit components. Further, although not shown in FIG. 2 for simplicity, the PMC 240 may include test and debugging resources (such as JTAG circuitry), external flash memory interfaces, and other components or circuits. In some implementations, the PMC 240 may allow portions of the PL 210 to be reconfigured using a partial reconfiguration operation. For example, a new configuration bitstream for a portion of the PL 210 can be loaded from the PS 230 via either a primary or secondary boot interface (such as PCIe or Ethernet), and then stored in configuration registers associated with the portions of the PL 210 to be reconfigured. The ability to allow for partial reconfiguration of one or more portions of the PL 210 may allow a user to more quickly reconfigure the device 200 to reflect changes or updates to the user-specified circuit design (such as compared with other programmable devices).

Figure 3:
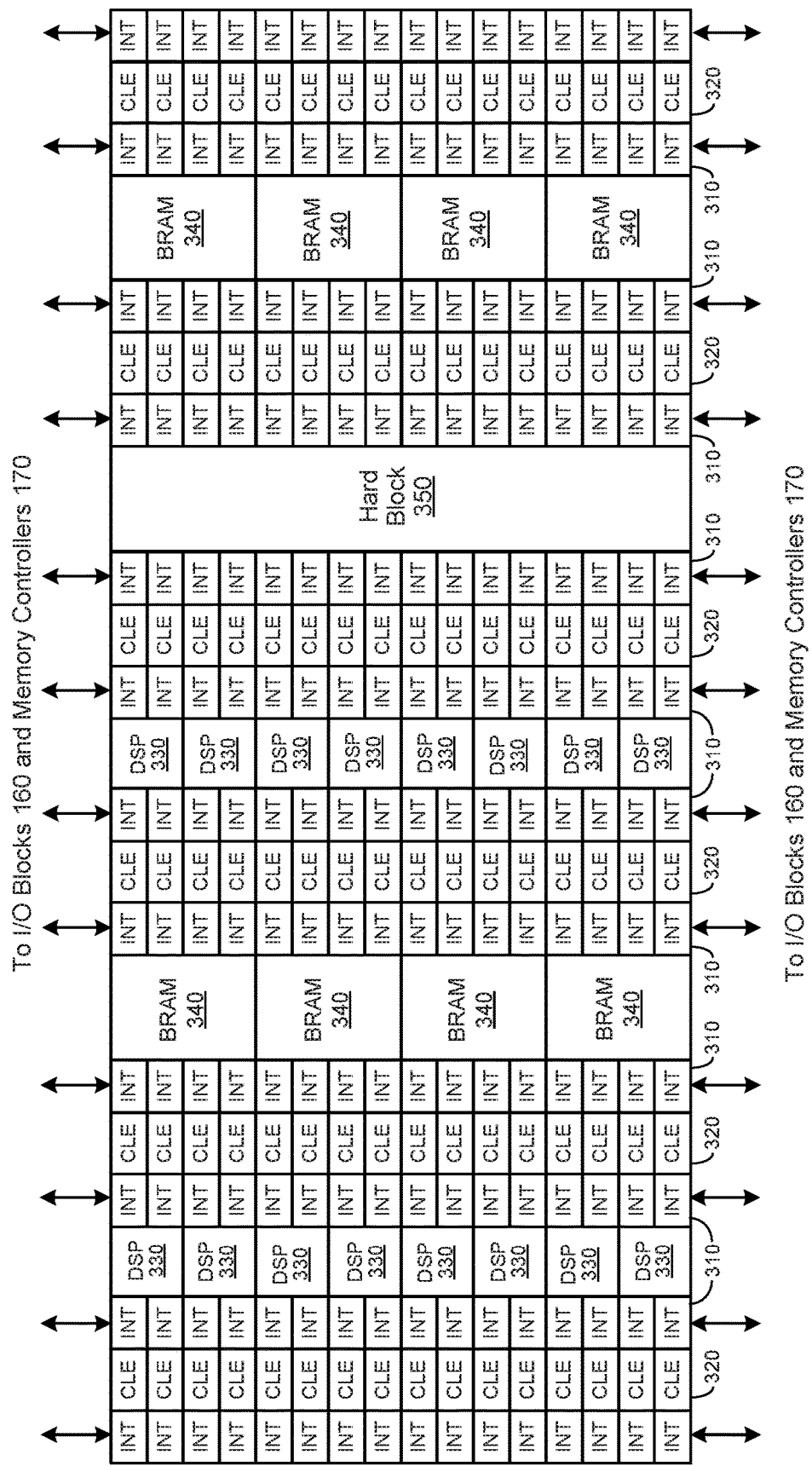
FIG. 3 shows a block diagram of an example programmable fabric, in accordance with some implementations.

FIG. 3 shows a block diagram of an example programmable fabric 300 in accordance with some implementations. In some implementations, the programmable fabric 300 may be the PL 110 of FIG. 1, the PL 210 of FIG. 2, or both. The programmable fabric 300 is shown to include a plurality of different programmable circuit blocks or tiles that can be arranged in columns (or rows). The programmable circuit blocks may include (but are not limited to) programmable interconnect elements (INT) 310, configurable logic elements (CLEs) 320, DSPs 330, and block RAMs (BRAMs) 340 arranged in a columnar architecture. For the example of FIG. 3, the programmable fabric 300 is shown to include eleven columns of programmable interconnect elements 310, five columns of CLEs 320, two columns of DSPs 330, and two columns of BRAM 340. In other implementations, the programmable fabric 300 may include other numbers of columns of programmable interconnect elements 310, CLEs 320, DSPs 330, and BRAMs 340. The programmable fabric 300 may also include a number of other subsystems or components not shown in FIG. 3 for simplicity (such as processing cores, programmable interconnect structures, and the like).

The programmable interconnect elements 310, the CLEs 320, the DSPs 330, and the BRAM 340 may be implemented as tiles that can be repeated across the programmable fabric 300. Each of the tiles may include at least one programmable interconnect element 310 that provides local signal interconnections to a programmable logic element within the same tile, that provides local signal interconnections to programmable interconnect elements 310 within adjacent tiles, and/or that provides local signal interconnections to other signal routing resources. The programmable interconnect elements 310 may collectively form at least a portion of the programmable interconnect fabric (or other suitable block-level and/or device-level signal routing structure).

In some implementations, the programmable fabric 300 may include a columnar hard block 350 that extends vertically across the height of the programmable fabric 300. The hard block 350 may include a number of hard-wired circuits such as, for example, USB controllers, Ethernet MACs, multi-rate (MR) Ethernet MACs, PCIe controllers, CCIX controllers, and/or other suitable circuits or components that implement the Physical Layer, the Data Link Layer, and the Transaction Layer of the PCIe protocol. In some implementations, the hard block 350 may be one implementation of the connectivity fabric described above with respect to FIG. 1.

Figure 4:
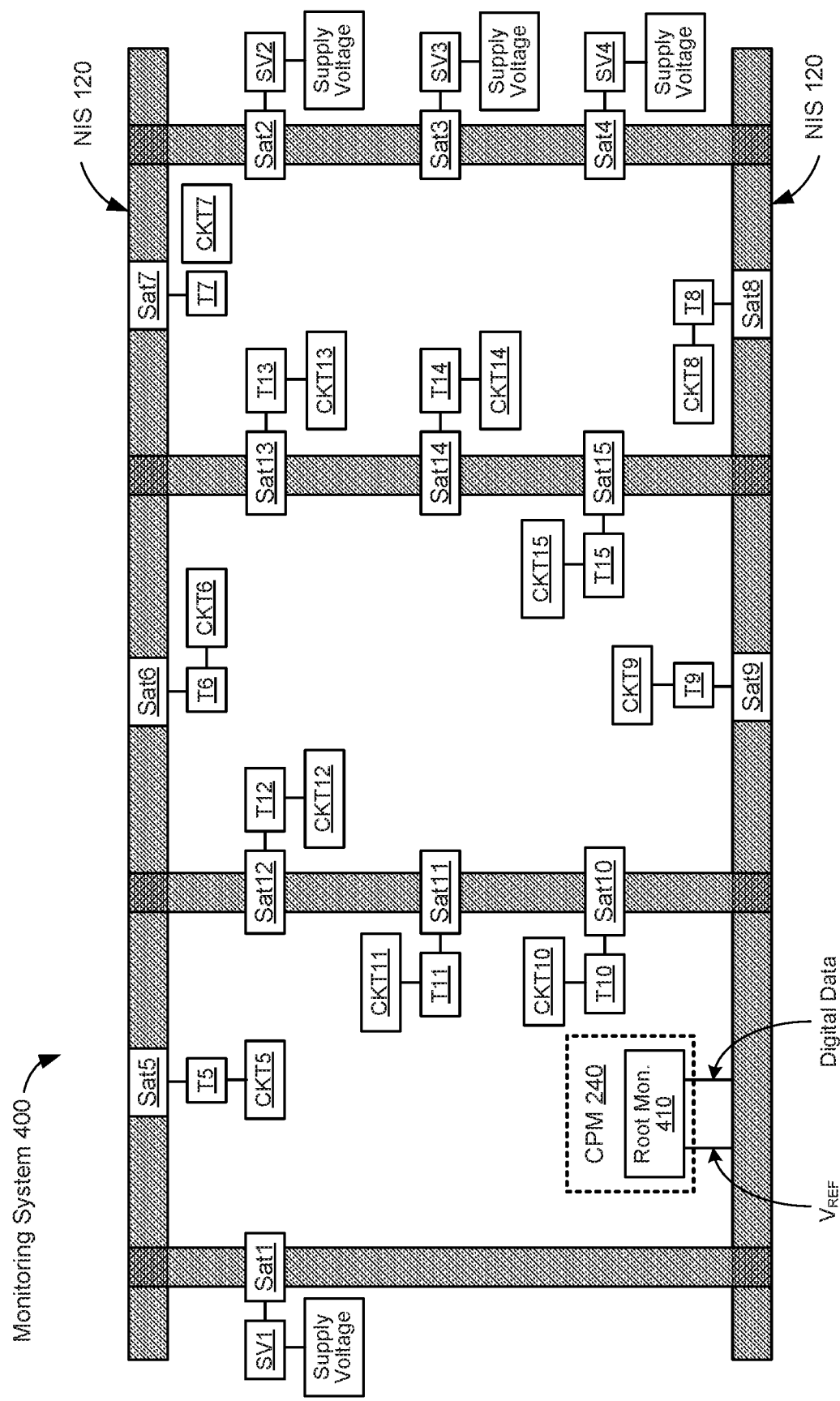
FIG. 4 shows a functional block diagram of a monitoring system, in accordance with some implementations.

FIG. 4 shows a functional block diagram of a monitoring system 400, in accordance with some implementations. The monitoring system 400, which may be implemented in the programmable device 100 of FIG. 1, is shown to include a root monitor 410, a plurality of satellite monitors SAT1-SAT15, a plurality of supply voltage sensors SV1-SV4, a plurality of temperature sensors T5-T15, and a plurality of selected circuits CKT5-CKT15. The root monitor 410, which may be one implementation of the root monitor 190 of FIG. 1, is coupled to the network interconnect system 120 and may include circuitry to generate the reference voltage ($V_{REF}$). In some implementations, the root monitor 410 may include a bandgap reference circuit (not shown for simplicity) that generates a temperature-compensated reference voltage $V_{REF}$.

The satellite monitors SAT1-SAT15 may be distributed across the device 100 and arranged such that each of the satellite monitors SAT1-SAT15 is positioned in a vicinity of a corresponding one of the sensors SV1-SV4 and T5-T15. For the example implementation of FIG. 4, the satellite monitors SAT1-SAT4 are coupled to respective supply voltage sensors SV1-SV4 via local signal wires, and the satellite monitors SAT5-SAT15 are coupled to respective temperature sensors T5-T15 via local signal wires. In this manner, analog signals generated by the supply voltage sensors SV1-SV4 may be provided to respective satellite monitors SAT1-SAT4 by local signal wires, and analog signals generated by the temperature sensors T5-T15 may be provided to respective satellite monitors SAT5-SAT15 by local signal wires. By positioning the satellite monitors SAT5-SAT15 proximate to (e.g., in the vicinity of) associated sensors SV1-SV4 and T5-T15, analog signals generated by the sensors SV1-SV4 and T5-T15 do not have to be routed across large portions of the device 100 to reach the root monitor 410, thereby minimizing signal degradation associated with routing relatively small analog signals across metal-layer interconnections that span across the device 100. Moreover, because analog signals generated by each of the sensors SV1-SV4 and T5-T15 may be locally converted into digital data using a nearby one of the satellite monitors SAT1-STA15, expensive metal-layer routing resources are not needed to implement the monitoring system 400 within a programmable device (such as the programmable device 100 of FIG. 1).

For one example, the sensor SV1 may monitor the operating conditions of an associated supply voltage by generating analog signals indicative of the voltage level of the associated supply voltage. By positioning the corresponding satellite monitor SAT1 in the vicinity of the sensor SV1, the analog signals generated by the sensor SV1 do not need to be routed across the device 100 to the root monitor 410, but instead may be routed a relatively short distance to the satellite monitor SAT1 via local signal wires. For another example, the sensor T5 may monitor the operating conditions of an associated circuit CKT5 by generating analog signals indicative of the temperature of the associated circuit CKT5. By positioning the corresponding satellite monitor SAT5 in the vicinity of the sensor T5, the analog signals generated by the sensor T5 do not need to be routed across the device 100 to the root monitor 410, but instead may be routed a relatively short distance to the satellite monitor SAT5 via local signal wires.

The reference voltage $V_{REF}$ may be distributed across the device 100 and made accessible to each of the satellite monitors SAT1-STA15 by one or more dedicated analog channels of the network interconnect system 120, and the digital data may be selectively routed from each of the satellite monitors SAT1-STA15 to the root monitor 410 by one or more digital channels of the network interconnect system 120. In some implementations, the one or more analog channels may be physically separated from the one or more digital channels.

Figure 5:
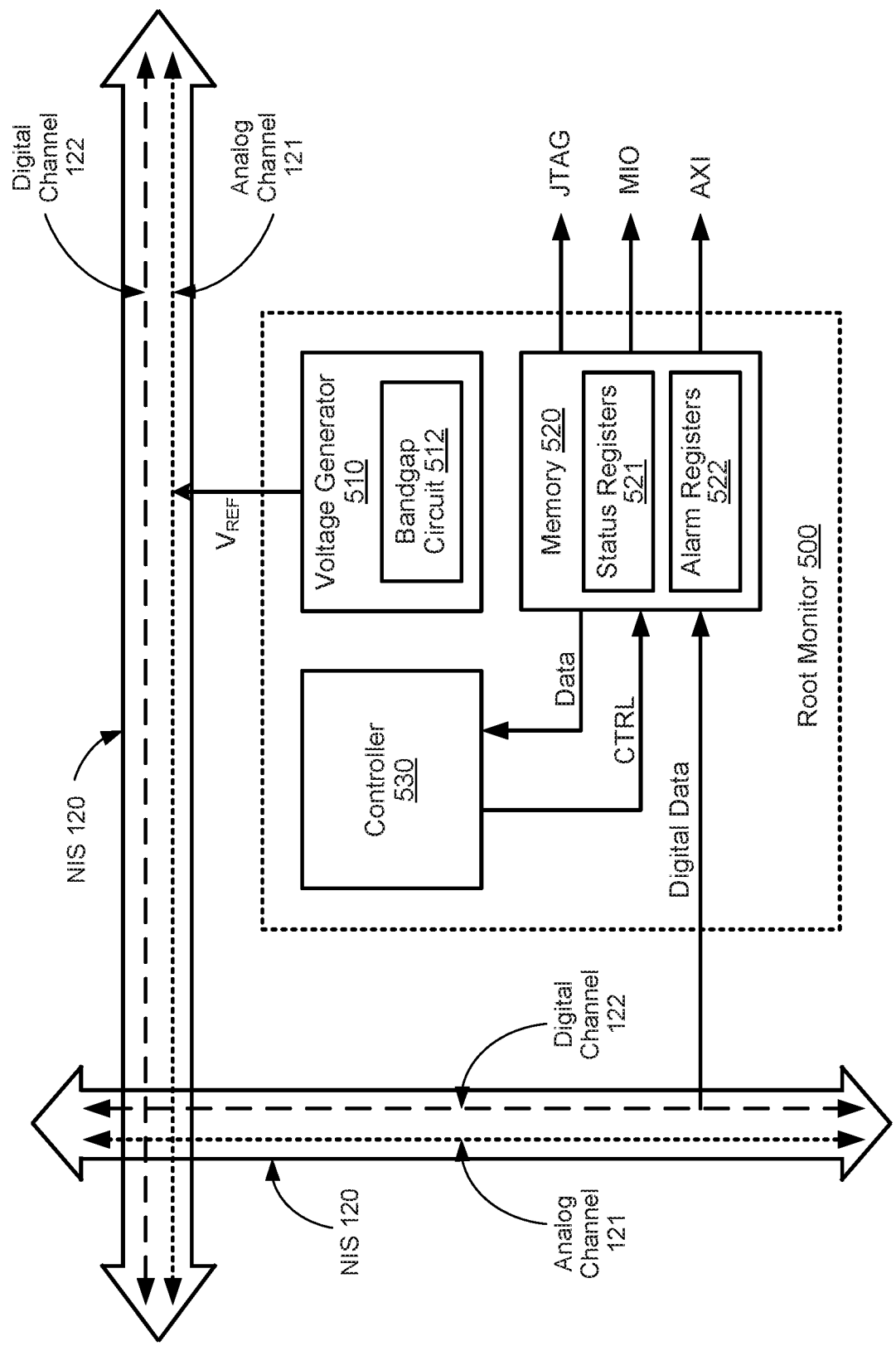
FIG. 5 shows a block diagram of an example root monitor, in accordance with some implementations.

FIG. 5 shows a block diagram of an example root monitor 500, in accordance with some implementations. The root monitor 500, which may be one implementation of the root monitor 190 of FIG. 1 or the root monitor 410 of FIG. 4 (or both), is shown to include a voltage generator 510, a memory 520, and a controller 530. The voltage generator 510, which may be any suitable circuit or device that can generate a trimmed voltage suitable for use as the reference voltage $V_{REF}$, includes an output coupled to one or more analog channels 121 of the network interconnect system 120. Referring also to FIG. 1, in some implementations, the reference voltage $V_{REF}$ generated by the voltage generator 510 may be distributed to each of the satellite monitors 192(1)-192(19) located throughout the device 100 using the one or more analog channels 121 of the network interconnect system 120. The satellite monitors 192(1)-192(19) may access the reference voltage $V_{REF}$ from the network interconnect system 120, and may use the distributed reference voltage $V_{REF}$ to perform analog-to-digital conversions (or for other suitable operations).

In some implementations, the voltage generator 510 may include a bandgap circuit 512 that can generate a temperature-compensated voltage, for example, so that the reference voltage $V_{REF}$ is adjusted for temperature variations. In addition, or in the alternative, the voltage generator 510 may provide both a positive reference voltage and a negative reference voltage to the one or more analog channels 121 of the network interconnect system 120. In some aspects, the reference voltage $V_{REF}$ may be equal to 1.25 volts, although other suitable voltages may be used as $V_{REF}$.

The memory 520 includes a data input coupled to one or more digital channels 122 of the network interconnect system 120, a control input coupled to the controller 530, a data output coupled to the controller 530, and one or more output ports from which data stored therein can be accessed by a user via one or more of a JTAG interface, a multiplexed input/output (MIO) block, or an AXI interface. In some implementations, the memory 520 may include a number of status registers 521 and a number of alarm register 522. The status registers 521 may store digital data indicative of operating conditions of the selected circuits provided throughout the device 100, and the alarm registers 522 may store a plurality of reference values that define a number of specified operating ranges. The status registers 521 may be loaded with digital data routed from the satellite monitors 192(1)-192(19) to the root monitor 500 via the network interconnect system 120, and the alarms registers 522 may be loaded with the reference values during configuration (or re-configuration) of the programmable device 100.

The controller 530 may control various operations of the root monitor 500, may analyze the digital data received from the satellite monitors 192(1)-192(19) to determine whether any of the selected circuits are not operating within their specified operating ranges, and may generate result data that can be accessed by the user. In some implementations, the controller 530 may determine whether a selected circuit is operating within a specified operating range by comparing the measured operating conditions stored in the status registers 521 with corresponding reference values stored in the alarms registers 522. If the selected circuit is determined to be operating outside of its specified operating range, the controller 530 may generate an alarm. In some aspects, the alarm may cause the selected circuit to be disabled or powered-down, for example, until the operating conditions of the selected circuit are within its specified operating range. In other aspects, the alarm may cause the programmable device 100 to be powered-down or to operate at a reduced power level, for example, until the operating conditions of the selected circuit are within the specified operating range.

Some of the specified operating ranges stored in the alarms registers 522 may be defined by a minimum reference value and a maximum reference value. In some implementations, a specified voltage range may include a minimum voltage value and a maximum voltage value. In such implementations, the controller 530 may compare the measured voltage of the selected circuit with the minimum and maximum voltage values stored in the alarms registers 522, and may generate one or more alarms based on the comparison. For example, if the measured voltage is between the minimum and maximum voltage values, the controller 530 may indicate that the selected circuit is operating within its specified voltage range. Conversely, if the measured voltage is less than the minimum voltage value or greater than the maximum voltage value, the controller 530 may generate an alarm to indicate that the selected circuit is not operating within its specified voltage range.

Other specified operating ranges stored in the alarms registers 522 may include a reference value that defines an upper operational limit. In some implementations, a specified temperature range for a selected circuit may be defined by a reference temperature value. In such implementations, the controller 530 may compare the measured temperature of the selected circuit with the reference temperature value stored in the alarms registers 522, and may generate one or more alarms based on the comparison. For example, if the measured temperature is less than (or equal to) the reference temperature value, the controller 530 may indicate that the selected circuit is operating within its specified temperature range. Conversely, if the measured temperature is greater than the reference temperature value, the controller 530 may generate an alarm to indicate that the selected circuit is too hot or overheated.

Figure 6:
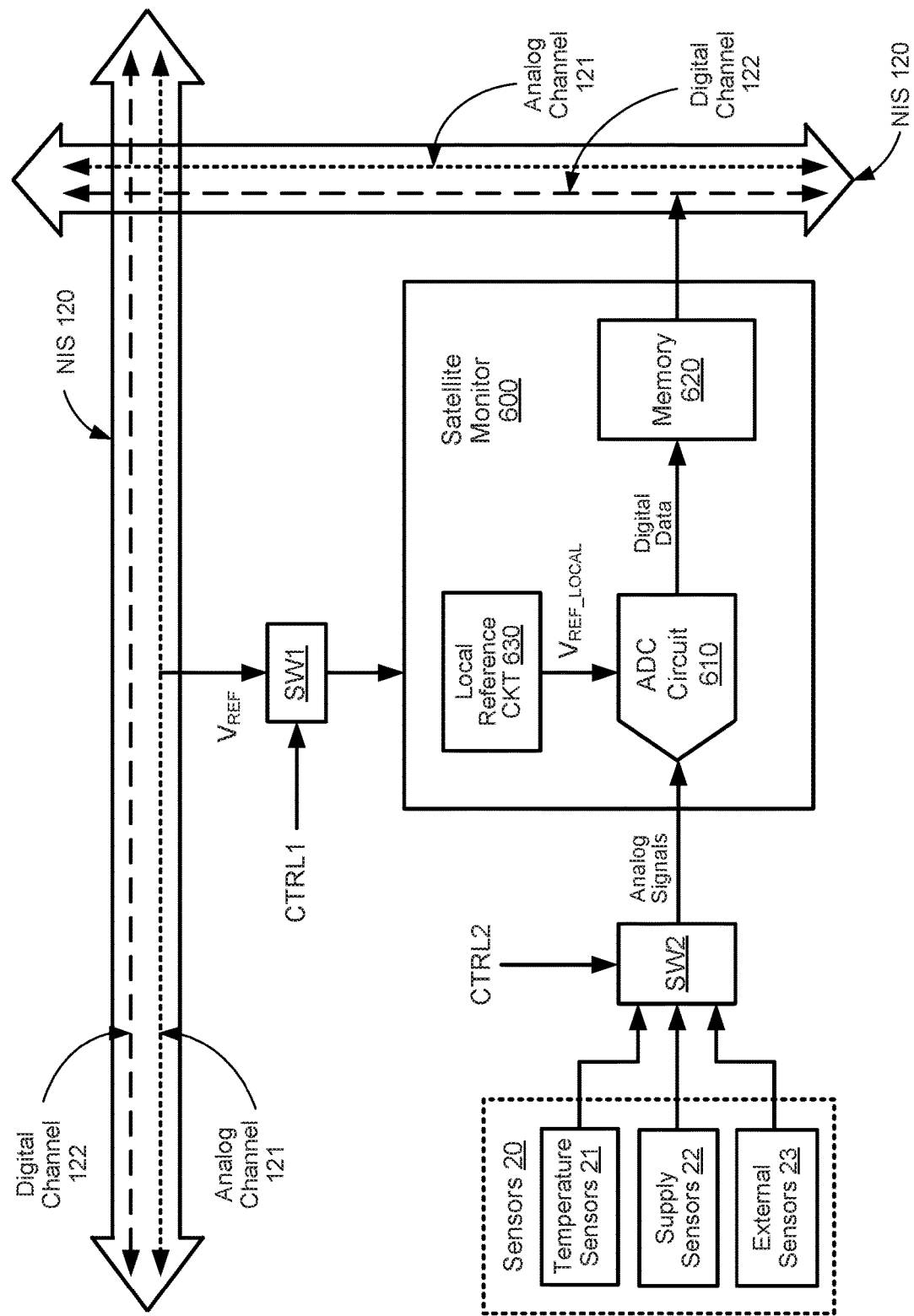
FIG. 6 shows a block diagram of an example satellite monitor, in accordance with some implementations.

FIG. 6 shows a block diagram of an example satellite monitor 600, in accordance with some implementations. The satellite monitor 600, which may be one example of any number of the satellite monitors 192(1)-192(19) of FIG. 1 or the satellite monitors SAT1-SAT15 of FIG. 4 (or both), includes a data input coupled to one or more sensors 20, an output coupled to the network interconnect system 120, and a reference terminal coupled to the network interconnect system 120 by a first switch SW1. Referring also to FIGS. 1 and 5, in some implementations, the satellite monitor 600 may receive the reference voltage $V_{REF}$ generated by the root monitor 500 and distributed by one or more analog channels 121 of the network interconnect system 120 via the first switch SW1. In some aspects, the sensors 20 may include (but are not limited to) temperature sensors 21, supply voltage sensors 22, and external sensors 23.

In the example of FIG. 6, the satellite monitor 600 is shown to include an ADC circuit 610, a memory 620, and a local reference circuit 630. The ADC circuit 610 includes inputs coupled to the one or more sensors 20 via a second switch SW2, an output coupled to the memory 620, and one or more reference terminals coupled to the local reference circuit 630. The ADC circuit 610 may be (or may include) any suitable ADC that can convert analog signals generated by one or more of the sensors 20 into digital signals or digital data. In some implementations, the ADC circuit 610 may utilize a scaled architecture to digitize analog sensing data provided by the sensors 20.

The memory 620, which may be any suitable storage device, includes an input coupled to the output of the ADC circuit 610, and includes an output coupled to the network interconnect system 120. The memory 620 may store digital data generated by the ADC circuit 610 in response to the analog signals provided by one or more of the sensors 20, and may provide the digital data to the one or more digital channels 122 of the network interconnect system 120 for routing to the root monitor 500 of FIG. 5. In some implementations, the memory 620 may be or may include a plurality of registers each for storing digital data indicative of the operating conditions of a corresponding one of a plurality of circuits selected for monitoring. In this manner, the satellite monitor 600 may receive analog signals indicative of operating conditions of a corresponding one of the selected circuits from the sensors 20, may convert the analog signals into digital data, and may provide digital data indicative of the operating conditions of the selected circuit to one or more digital channels 122 of the network interconnect system 120.

The local reference circuit 630, which is coupled between the first switch SW1 and the one or more reference terminals of the satellite monitor 600, may be any suitable device or component that can provide a local reference voltage ($V_{REF\_LOCAL}$) to the ADC circuit 610. In some implementations, the local reference voltage $V_{REF\_LOCAL}$ may be based at least in part on the reference voltage $V_{REF}$ distributed by the network interconnect system 120, may be used by the ADC circuit 610 to perform analog-to-digital conversions.

The first switch SW1 may be configured to selectively couple the reference voltage $V_{REF}$ distributed by the network interconnect system 120 to the satellite monitor 600 based on a first control signal (CTRL1). In some implementations, the first switch SW1 may couple the reference terminal of the satellite monitor 600 to the network interconnect system 120 when the first control signal CTRL1 is in an asserted state (such as logic high), and may isolate the satellite monitor 600 from the network interconnect system 120 when the first control signal CTRL1 is in a de-asserted state (such as logic low). In this manner, the first switch SW1 may be used to control when (and for how long) the satellite monitor 600 accesses the reference voltage $V_{REF}$ distributed by the network interconnect system 120.

The first control signal CTRL1 may be generated by the root monitor 500 of FIG. 5, and may be routed to the satellite monitor 600 by the network interconnect system 120 (or by other suitable signal interconnections). Referring also to FIGS. 1 and 5, in some implementations, the root monitor 500 may assert the first control signal CTRL1 for each of a plurality of satellite monitors 600 distributed across a programmable device based on a timing schedule, for example, such that only one of the satellite monitors 600 can access the distributed reference voltage $V_{REF}$ via the network interconnect system 120 at any given instant in time. In this manner, the root monitor 500 may prevent dips in the distributed reference voltage $V_{REF}$ caused by more than one of the satellite monitors 600 accessing the distributed reference voltage $V_{REF}$ at the same time.

The second switch SW2 may selectively couple one of the sensors 21-23 to the input of the ADC circuit 610 based on a second control signal (CTRL2). In some implementations, the second control signal CTRL2 may be generated by the root monitor 500 of FIG. 5, and may be routed to the satellite monitor 600 by the network interconnect system 120 (or by other suitable signal interconnections).

Figure 7:
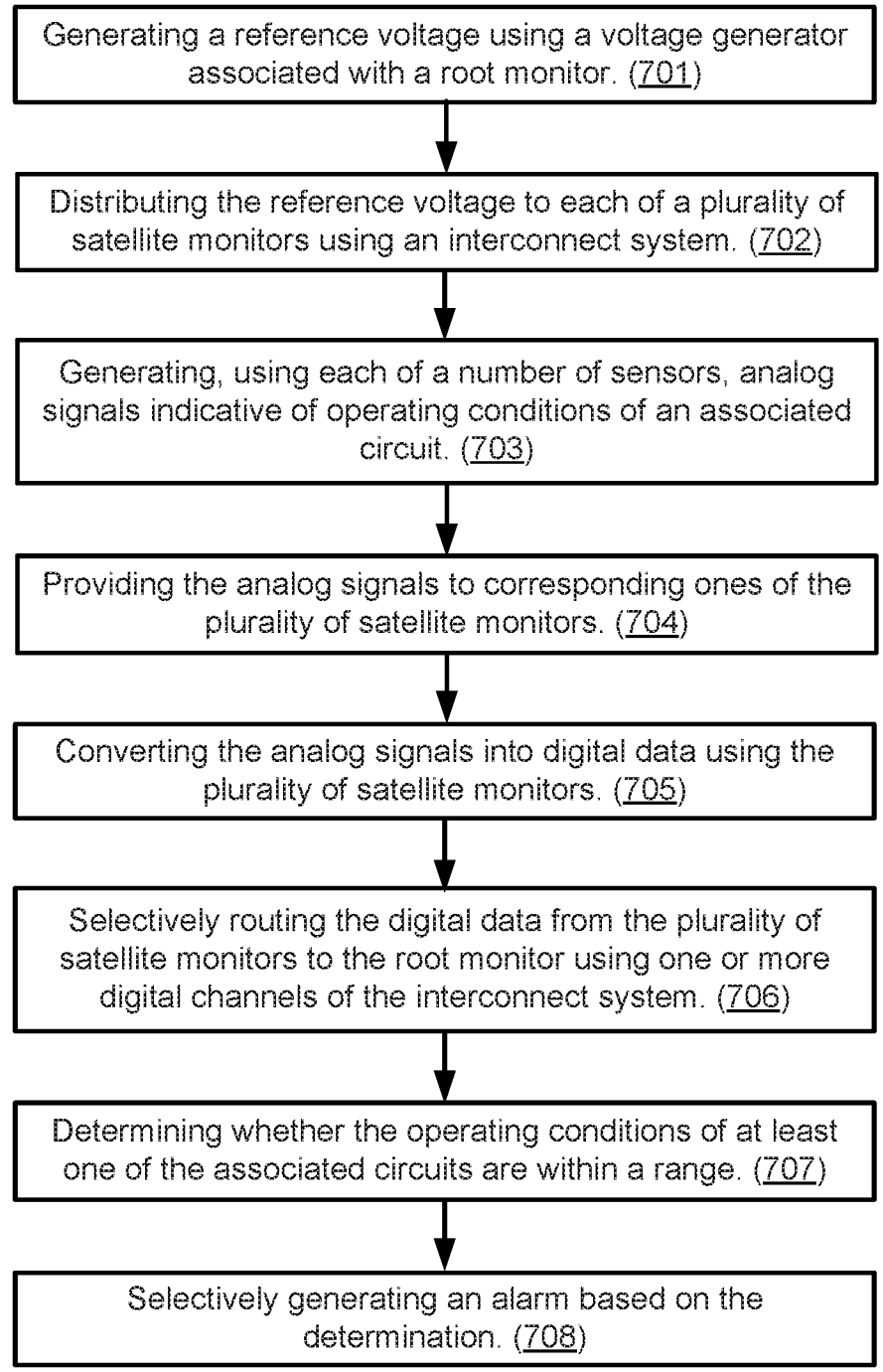
FIG. 7 is an illustrative flow chart depicting an example operation for monitoring a number of operating conditions of a programmable device, in accordance with some implementations.

FIG. 7 is an illustrative flow chart depicting an example operation 700 for monitoring a number of operating conditions of a programmable device, in accordance with some implementations. The example operation 700 is described below with respect to the programmable device 100 of FIG. 1, the monitoring system 400 of FIG. 4, the root monitor 500 of FIG. 5, and the satellite monitor 600 of FIG. 6 for illustrative purposes only. It is to be understood that the example operation 700 may be performed by other programmable devices disclosed herein and/or by other suitable devices.

The operation 700 may begin at block 701 by generating a reference voltage ($V_{REF}$) using a voltage generator 510 associated with a root monitor 190 provided within the programmable device 100. In some implementations, the root monitor 190 may generate a trimmed and temperature-compensated reference voltage $V_{REF}$, for example, using the bandgap circuit 512 of FIG. 5.

The operation 700 may proceed at block 702 by distributing the reference voltage $V_{REF}$ from the root monitor 190 to each of a plurality of satellite monitors 192 using one or more analog channels 121 of the interconnect system 120. In some implementations, distributing the reference voltage $V_{REF}$ may include selectively coupling each of the plurality of satellite monitors 192(1)-192(19) to the interconnect system 120 based on a corresponding control signal CTRL1 generated by the root monitor 190. In some aspects, the first switch SW1 of FIG. 6 may allow the satellite monitor 600 to access the reference voltage $V_{REF}$ from the network interconnect system 120 based on a first state of CTRL1, and the first switch SW1 may isolate the satellite monitor 600 from the network interconnect system 120 based on a second state of CTRL1.

The operation 700 may proceed at block 703 by generating, using each of a number of sensors 20, analog signals indicative of operating conditions of an associated circuit. In some implementations, each of the number of sensors 20 may be located in the vicinity of the associated circuit. In some aspects, the sensor 20 may be (or may include) at least one of a temperature sensor 21, a supply voltage sensor 22, or an external sensor 23.

The operation 700 may proceed at block 704 by providing the analog signals generated by the number of sensors 20 to corresponding ones of the plurality of satellite monitors 192(1)-192(19). In some implementations, the analog signals generated by the sensors 20 may be provided to corresponding satellite monitors 192(1)-192(19) using relatively short local signal wires, for example, in contrast to conventional programmable devices in which analog signals indicative of operating conditions of various circuits are routed across the device and provided to a central monitor using a metal-layer signal routing structure.

The operation 700 may proceed at block 705 by converting the analog signals into digital data using the plurality of satellite monitors 192(1)-192(19). Referring also to FIG. 6, the ADC circuit 610 provided within each of the satellite monitors 192(1)-192(19) may convert the analog signals into digital data that can be stored in the memory 620 of each of the satellite monitors 192(1)-192(19). The memory 620 may selectively provide the stored digital data to the interconnect system 120 for routing to the root monitor 190.

The operation 700 may proceed at block 706 by selectively routing the digital data from the plurality of satellite monitors 192(1)-192(19) to the root monitor 190 using one or more digital channels 122 of the interconnect system 120. Referring also to FIG. 4, the digital channels 122 may be physically separate from the analog channels 121 of the interconnect system 120. In some implementations, the satellite monitors 192(1)-192(19) may provide the digital data to the interconnect system 120 in response to a signal (such as a trigger signal) generated by the root monitor 190, for example, to schedule or prioritize the delivery of digital data from the plurality of satellite monitors 192(1)-192(19) to the root monitor 190. In other implementations, the satellite monitors 192(1)-192(19) may provide the digital data to the interconnect system 120 without prompting and/or without control by the root monitor 190.

The operation 700 may proceed at block 707 by determining whether the operating conditions of at least one of the associated circuits are within a range, and may proceed at block 708 by selectively generating an alarm based on the determination. Referring also to FIG. 5, the root monitor 500 may receive digital data from a selected one of the satellite monitors 192(1)-192(19), and may compare the received digital data with one or more reference values to determine whether the operating conditions of the associated circuit are within the range. In some implementations, the root monitor 500 may generate alarms and/or may power-down one or more portions of the programmable device 100 (or the entire programmable device 100 if a number of the various circuits, blocks, and subsystems do not remain within their specified operating parameters.

For implementations in which the analog signals are indicative of a voltage of an associated circuit (such as voltage supply), the root monitor 500 may compare the measured voltage of the associated circuit with minimum and maximum reference voltage levels. If the measured voltage of the associated circuit is between the minimum and maximum reference voltage levels, the root monitor 190 may determine that the associated circuit is operating within a specified voltage range. Conversely, if the measured voltage of the associated circuit is less than the minimum reference voltage level or is greater than the maximum reference voltage level, the root monitor 190 may determine that the associated circuit is not operating within the specified voltage range.

For implementations in which the analog signals are indicative of a temperature of an associated circuit, the root monitor 500 may compare the measured temperature of the associated circuit with a reference temperature value. If the measured temperature of the associated circuit is not greater than the reference temperature value, the root monitor 190 may determine that the associated circuit is operating within its specified temperature range. Conversely, if the measured temperature of the associated circuit is greater than the reference temperature value, the root monitor 190 may determine that the associated circuit is not operating within the specified temperature range.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example implementations have been described with reference to specific example implementations thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A device, comprising:
   a root monitor including circuity configured to generate a reference voltage;
   a number of sensors distributed in various locations across the device, each of the sensors configured to measure operating conditions of an associated circuit at a corresponding one of the various locations;
   a plurality of satellite monitors distributed in the various locations across the device, each of the satellite monitors coupled to one or more associated sensors located in a vicinity of the corresponding satellite monitor, wherein each of the plurality of satellite monitors comprises an analog-to-digital converter (ADC), including an input to receive analog signals indicative of operating conditions measured by the one or more associated sensors, an output to provide digital data to an interconnect system, and a reference terminal to receive a local reference voltage; and
   the interconnect system coupled to the root monitor and to each of the plurality of satellite monitors, wherein the interconnect system is configured to:
      distribute the reference voltage from the root monitor to each of the plurality of satellite monitors; and
      selectively route the digital data from each of the plurality of satellite monitors to the root monitor, wherein the digital data is indicative of the measured operating conditions.

2. The device of claim 1, wherein the operating conditions include at least one of a temperature or a voltage level.

3. The device of claim 1, wherein the root monitor comprises a bandgap circuit configured to compensate the reference voltage for temperature variations.

4. The device of claim 1, wherein the device is a programmable logic device and further comprises:
   a plurality of configurable logic resources distributed across one or more portions of the device.

5. The device of claim 1, wherein the local reference voltage is based at least in part on the reference voltage distributed by the interconnect system.

6. The device of claim 1, wherein each of the satellite monitors further comprises:
   a memory including an input coupled to the output of the ADC, including an output coupled to the interconnect system, and configured to store the digital data provided by the ADC.

7. The device of claim 1, wherein each of the satellite monitors further comprises:
   a switch configured to selectively couple the reference voltage distributed by the interconnect system to the satellite monitor based on a control signal generated by the root monitor.

8. The device of claim 7, wherein the control signals are configured to couple the reference voltage distributed by the interconnect system to only one of the satellite monitors at the same time.

9. The device of claim 1, wherein at least some of the plurality of satellite monitors are integrated within the interconnect system.

10. The device of claim 1, wherein the interconnect system further comprises:
    one or more analog channels configured to distribute the reference voltage from the root monitor to each of the plurality of satellite monitors; and
    one or more digital channels configured to selectively route the digital data from the satellite monitors to the root monitor as individually addressable data packets.

11. The device of claim 1, wherein the root monitor further comprises:
    a memory configured to store the digital data received from each of the plurality of satellite monitors; and
    a controller configured to determine whether the measured operating conditions of at least one of the associated circuits are within a range.

12. A system for monitoring a number of operating conditions of a device, the system comprising:
    a root monitor including circuity configured to generate a reference voltage;
    a plurality of sensors distributed across the device, each of the sensors configured to generate analog signals indicative of operating conditions of an associated circuit;
    a plurality of satellite monitors distributed across the device, each of the satellite monitors configured to convert the analog signals generated by one or more associated sensors into digital data, wherein each of the satellite monitors comprises an analog-to-digital converter (ADC) configured to convert the analog signals generated by the one or more associated sensors into the digital data and a reference terminal to receive a local reference voltage; and
    an interconnect system coupled to at least the root monitor and each of the plurality of satellite monitors, the interconnect system comprising:
       one or more analog channels configured to distribute the reference voltage from the root monitor to each of the plurality of satellite monitors; and
       one or more digital channels configured to selectively route the digital data from each of the plurality of satellite monitors to the root monitor.

13. The system of claim 12, wherein each of the satellite monitors further comprises:
a switch configured to selectively couple the reference voltage distributed by the interconnect system to the satellite monitor based on a control signal generated by the root monitor.

14. The system of claim 13, wherein the control signals are configured to couple the reference voltage distributed by the interconnect system to only one of the satellite monitors at the same time.

15. A method of monitoring a number of operating conditions of a device, the method comprising:
generating a reference voltage using a voltage generator associated with a root monitor provided within the device;
distributing the reference voltage to each of a plurality of satellite monitors using one or more analog channels of an interconnect system integrated within the device, wherein each of the plurality of satellite monitors comprises an analog-to-digital converter (ADC), an output to provide digital data to the interconnect system, and a reference terminal to receive a local reference voltage;
generating, using each of a number of sensors, analog signals indicative of operating conditions of an associated circuit;
providing the analog signals generated by the number of sensors to corresponding ones of the plurality of satellite monitors;
converting the analog signals into digital data using the plurality of satellite monitors; and
selectively routing the digital data from the plurality of satellite monitors to the root monitor using one or more digital channels of the interconnect system.

16. The method of claim 15, wherein the operating conditions include at least one of a temperature or a voltage level.

17. The method of claim 15, wherein distributing the reference voltage further comprises:
selectively coupling each of the plurality of satellite monitors to the interconnect system based on a corresponding control signal generated by the root monitor.

18. The method of claim 17, wherein the control signals are configured to couple the reference voltage distributed by the interconnect system to only one of the satellite monitors at the same time.

* * * * *